United States Patent [19]

Schuermeyer et al.

[11] 4,064,492
[45] Dec. 20, 1977

[54] VIRTUALLY NONVOLATILE RANDOM ACCESS MEMORY CELL

[76] Inventors: Fritz L. Schuermeyer, 1759 Southview, Yellow Springs, Ohio 45387; Charles R. Young, 241 Cato Drive, Xenia, Ohio 45385

[21] Appl. No.: 729,633

[22] Filed: Oct. 5, 1976

[51] Int. Cl.² .................. G11C 7/00; G11C 11/24; G11C 11/34
[52] U.S. Cl. ......................... 365/184; 307/238; 357/23; 365/189; 365/222
[58] Field of Search ............ 340/173 R, 173 CA; 307/238; 357/23, 54

[56] References Cited

U.S. PATENT DOCUMENTS

| | | | |
|---|---|---|---|
| 3,911,464 | 10/1975 | Chang et al. | 357/23 |
| 3,916,390 | 10/1975 | Chang et al. | 340/173 R |

*Primary Examiner*—Stuart N. Hecker
*Attorney, Agent, or Firm*—Joseph E. Rusz; Robert Kern Duncan

[57] ABSTRACT

A dynamic, virtually nonvolatile random access memory (RAM) storage cell is provided by storing information in a Nonvolatile Charge Injection Device (NOVCID), first in volatile form, then by an electric signal transferring the stored intelligence into a nonvolatile form from which it may late be recovered. Since only on external command is the information transferred into the nonvolatile storage mode, the memory is described as a virtually nonvolatile RAM.

2 Claims, 5 Drawing Figures

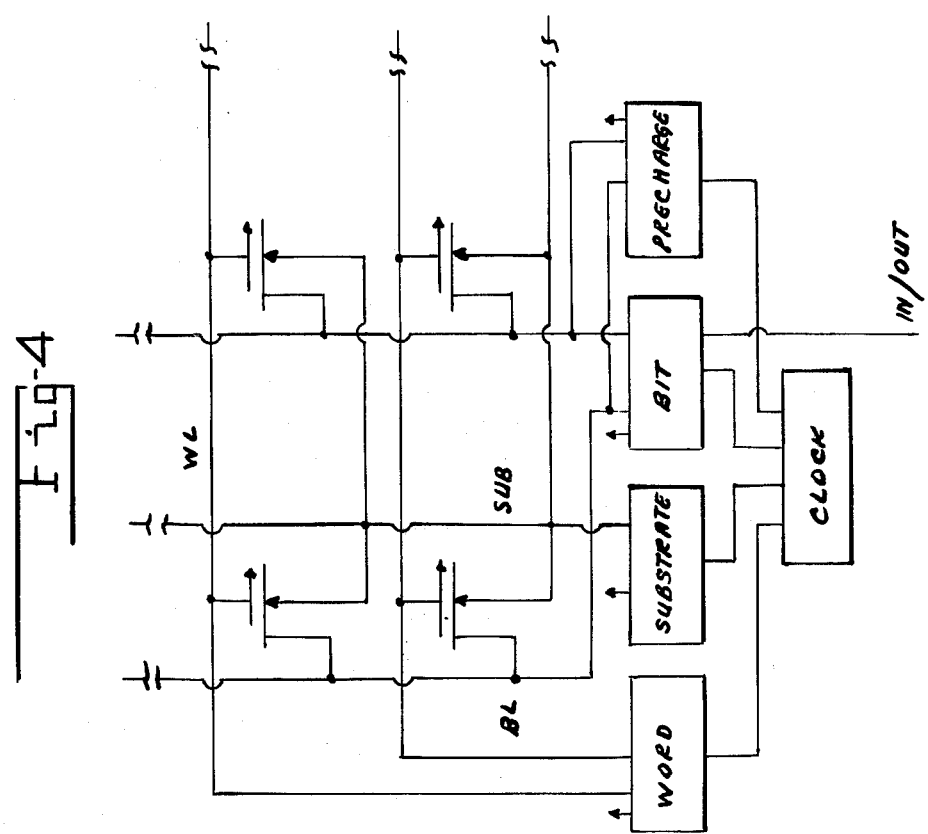

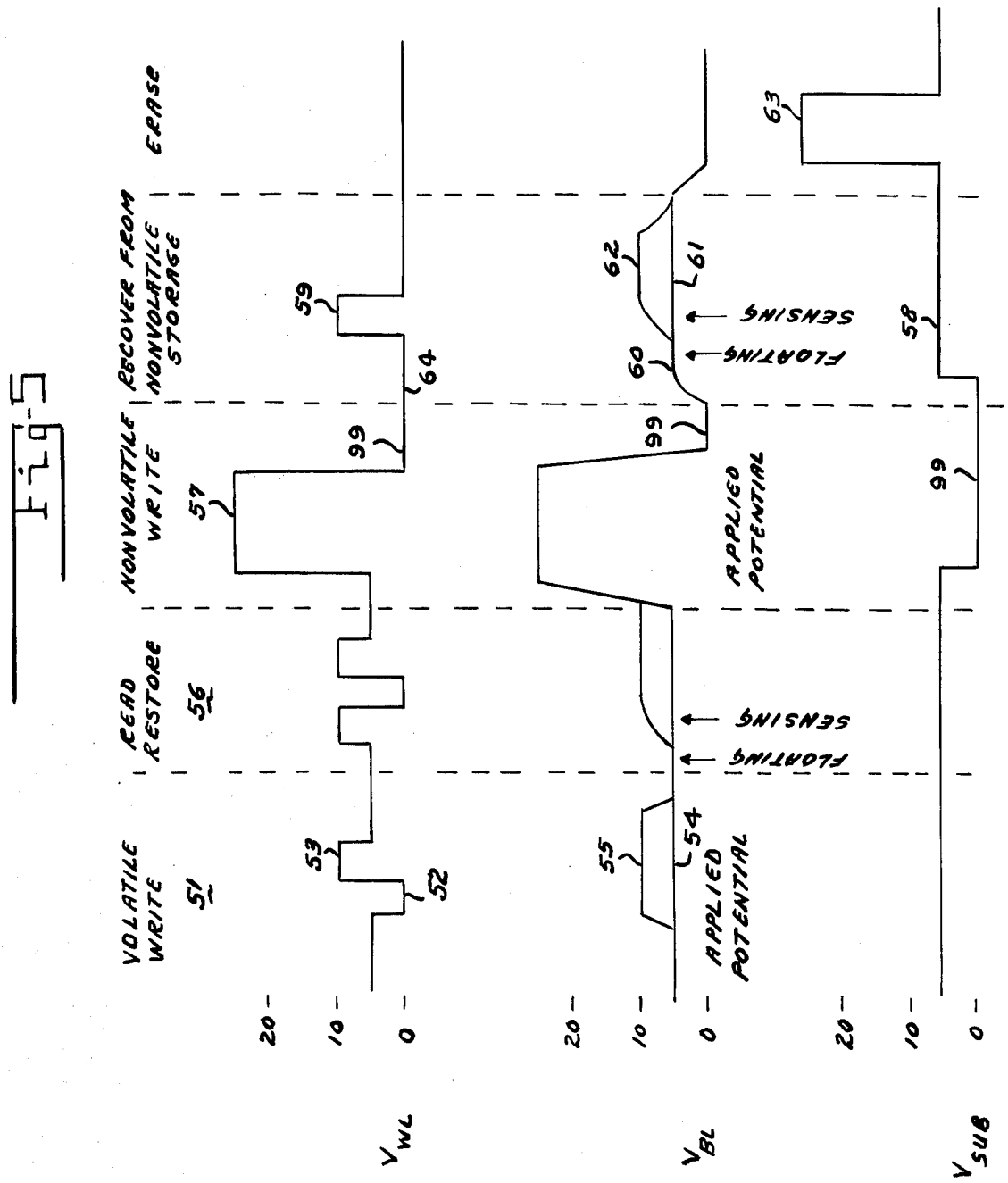

VIRTUALLY NONVOLATILE RANDOM ACCESS MEMORY CELL

RIGHTS OF THE GOVERNMENT

The invention described herein may be manufactured and used by or for the Government of the United States for all governmental purposes without the payment of any royalty.

BACKGROUND OF THE INVENTION

The field of the invention is in solid state information storage devices and particularly in dynamic, virtually nonvolatile, charge injection memory cells.

Nonvolatile charge injection devices and dynamic volatile RAMs are well known. The invention is the combination of structures and elements and method of operation to provide a novel, dynamic, virtually nonvolatile memory cell. Examples of typical prior art devices are exemplified in U.S. Pat. Nos. 3,911,464 to patentees Chang and Lee; 3,877,055 to patentees Fisher and Powell; 3,908,182 to patentees Lampe, White and Blaha; 3,836,894 to patentee J. R. Cricchi; and 3,889,287 to patentee M. W. Powell. The concept of virtually nonvolatile data storage was presented by J. C. Lockwood et al. at the 1972 WESCON, Sept. 19–22, 1972, Los Angeles, CA.

SUMMARY OF THE INVENTION

A memory cell is disclosed that has high performance in both volatile and nonvolatile storage modes with access time being less than 300 nsec. High storage density is provided (16 to 32 K bits/chip) at a very low cost per bit memory. The two-storage mode operation practically eliminates the endurance problem presently encountered in current MNOS devices.

BRIEF DESCRIPTION OF THE DRAWING

FIG. 4 illustrates in block-schematic form the control circuitry of a typical memory matrix; and FIG. 5 graphically represents typical waveforms occurring in a storage unit of a cell.

DESCRIPTION OF THE PREFERRED EMBODIMENT

Figure 1:
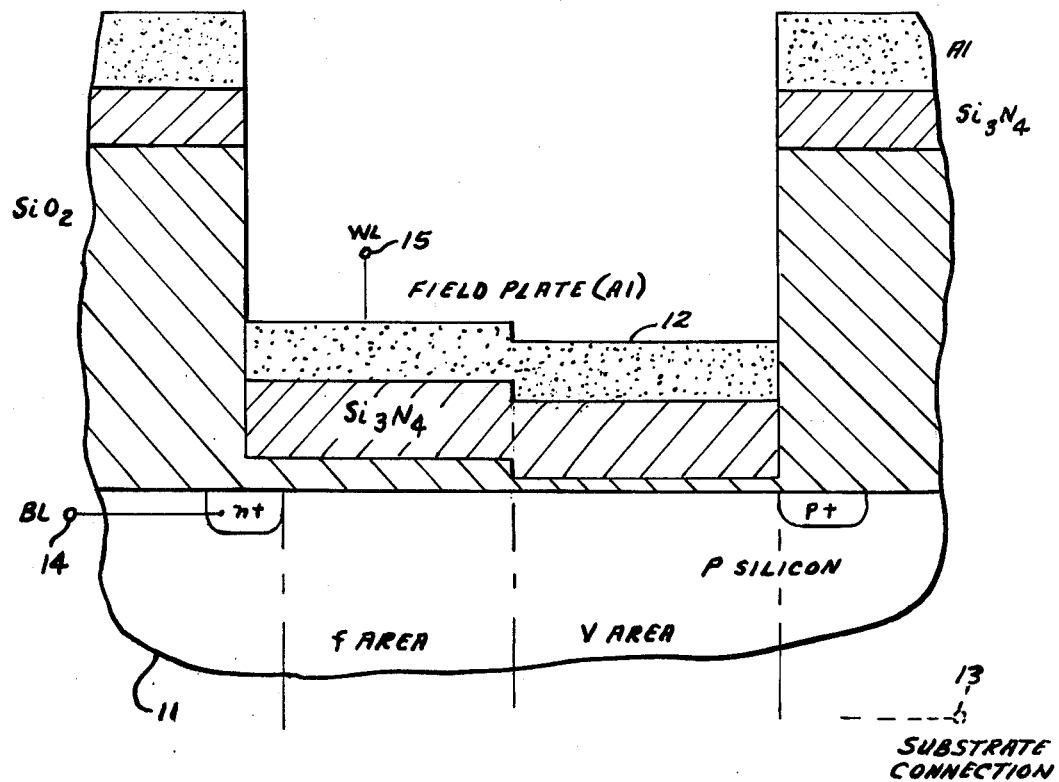
FIG. 1 schematically illustrates a preferred NOVCID structure.

The preferred structural arrangement of a prior art Metal-Nitride-Oxide-Semiconductor NOVCID for this invention is illustrated schematically in FIG. 1. As is shown, n-channel technology and well pumping is the preferred mode of operation. The state of an NOVCID, fabricated as shown, can be altered electrically. When a positive pulse (e.g., 25V, 10 msec) is applied to substrate 11 (by a conventional bottom electrode, — represented but not diagrammed), of the NOVCID while field plate 12 is held at zero volt potential, a large well is formed. This state of the NOVCID will be referred to as the erased or "H" state. When a positive pulse (e.g., 25V, 1 msec) is applied to field plate 12 while the substrate and the n+ area are held at zero potential, the size of the potential well is diminished or the well is eliminated. This state is referred to as the written state or the "L" state.

In the operation of the NOVCID as a dynamic RAM cell in the volatile mode, the NOVCID is in the "H" state and in standby when all terminals, i.e., substrate terminal 13, bit line (BL) terminal 14, and word line (WL) terminal 15 are all at approximately +5 volt potential. This is diagrammed in FIG. 5 by the potential levels at the start of volatile write area 51. In order to write into the device, all presently stored charge has to be removed by putting the device into accumulation for a short time (50 nsec). Accumulation is accomplished by applying 0V to the field plate. This is indicated at 52 in the word line voltage curve ($V_{WL}$) of FIG. 5. In order to write, approximately a +10 volt potential 53 is put on the field plate for a short time (50 nsec, typical). Simultaneously, the n+ area is held at approximately +5 volts (54 on $V_{BL}$ curve of FIG. 5) for writing a "zero", or at +10 volts for writing a "one". This is indicated at 55 on the $V_{BL}$ curve. Consequently the device, storing a "zero" has its well filled up with electrons while a "one" is represented by an empty well. After writing of the device, it is held in the standby mode. In order to read the information from the NOVCID, the n+ area, which is now floating at a precharged +5 volt level, is connected to a sense circuit. Simultaneously, a short (e.g., 50 nsec) 10 volt pulse is applied to the field plate. For the "one" state the n+ area will be charged in accordance to the well potential; no charging of the n+ area will occur for the "zero" state since the well has been filled during the write cycle. Since the read process destroys the information in the NOVCID, this information has to be rewritten after each read process. As in all dynamic memory cells, the information degrades with time. Consequently, the information must be refreshed periodically by first reading the device and then rewriting the information into the device. This is indicated by the potential curves of FIG. 5 in read/restore area 56.

To transfer information from the volatile to the nonvolatile form, a pulse 57 of approximately +25 volts and 1 msec duration is applied to the field plate. The potential across the insulator ($SiO_2$) of the NOVCID depends on the charge store in the well. Consequently, the potential across the insulator of a "zero" is approximately 5 volts higher than that of a "one". Hence, the device containing a zero will be written into the "L" state while the device containing a "one" will remain in the "H" state. To recover the data from the nonvolatile storage mode, the device is first put into accumulation (0 volt on the field plate, illustrated at 64, and a +5 volt on the substrate, illustrated at 58). (It is to be noted that normally prior to reading or recovering the stored information from the nonvolatile state that the device has been dormant with no potentials applied whatsoever to the structure, as indicated at the end 99 of the nonvolatile write time period.) Then a pulse 59, of approximately 10 volts and 50 nsec in duration is applied to the field plate. Simultaneously, the n+ area which is floating at +5 volts, as illustrated at 60, is connected to the sense circuit. The NOVCID storing a "zero" is in the "L" state and consequently will charge the n+ area only minimally as at 61, while the device storing a "one" is in the "H" state and will charge the n+ area, as at 62, according to the well size. The sensing circuit then latches a signal in accordance with the magnitude of the charge which is indicative of the stored information. The device is then erased by the approximately 25 volt pulse 63 and ready for information to be written back into the device.

In order to avoid charges, pumped into the substrate, moving into adjacent wells a barrier separating the individual NOVCID units is required. This may be conventional p+ area, or alternatively, a dielectric isolation barrier. Since in the volatile mode, always one full row is written or read, a sense circuit/latch is required for each bit line. Hence, for a write cycle, first all the information of the addressed row has to be read into the latches, the latch representing the bit to be altered must be set to the correct state and then the information must be written back into the row simultaneously.

After recovery of the data stored in the nonvolatile form, the NOVCIDs of the selected row must be erased by applying a +25 volt, 10 msec pulse (as previously discussed), to the substrate of this particular row. Consequently, isolation of the substrates of the different rows would be required. This isolation requires much space and makes the array bulky. A better, and generally preferred, solution to this problem is to use two separate arrays, the substrates of these arrays being isolated from each other. After reading the nonvolatile data from one array, the information is stored in the volatile mode in the second array. Then after all the information has been transferred to the second array the first array is erased. In order to achieve immunity against processing variations, a two device per bit configuration with differential sensing is conventional and recommended.

Figure 2:
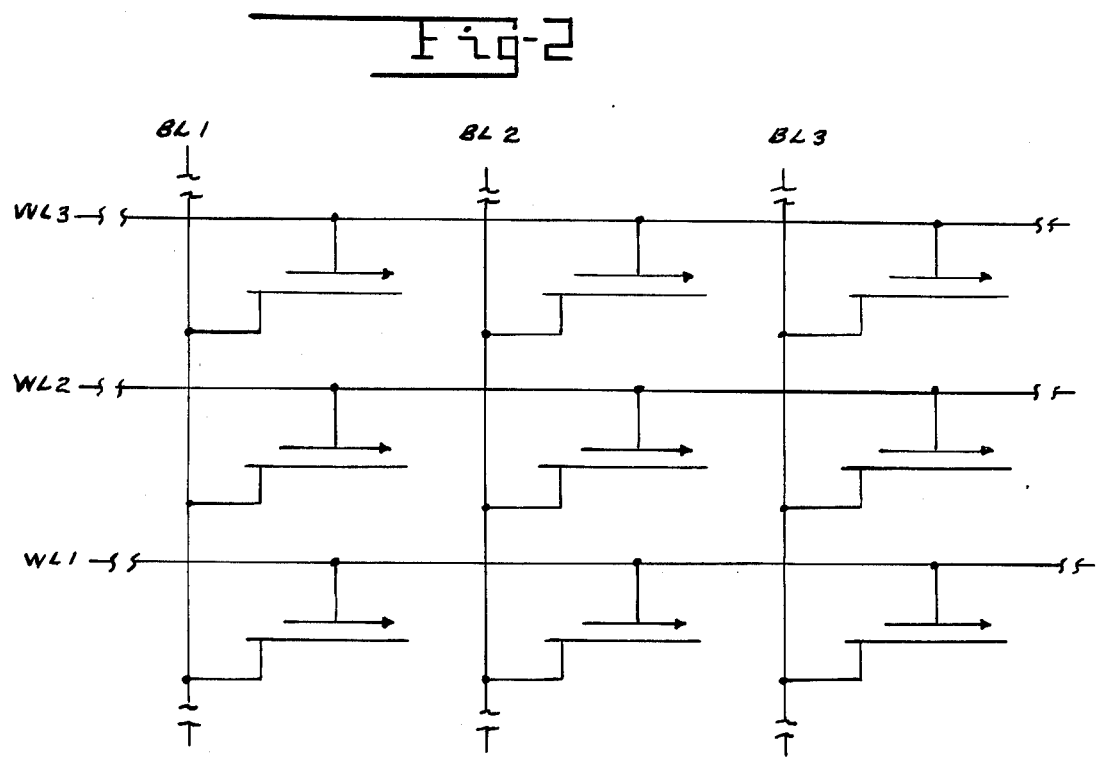
FIG. 2 schematically illustrates, in outline form, typical cell arrangement.

FIG. 2 is representative of the matrix of an array illustrating the multiplicity of storage units, arranged in rows, controlled in orderly fashion from a word line common to each horizontal row and a bit line common to each vertical row. The substrate which is common to all the storage devices is not shown, as is conventional.

Figure 3:
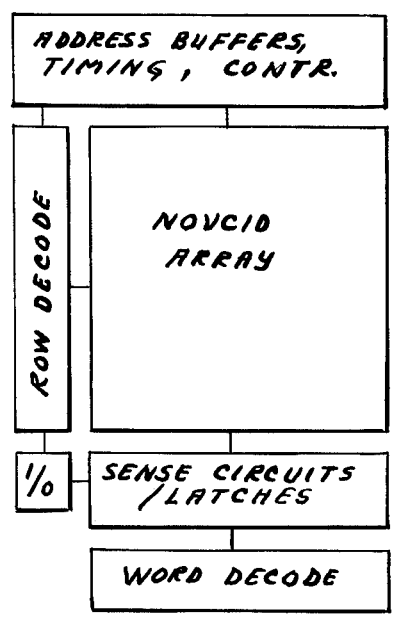
FIG. 3 illustrates, in block form, a typical array configuration including cooperating circuitry.

FIG. 3 illustrates a typical configuration of NOVCID array and the associated circuits as would be installed in a memory bank, while FIG. 4 illustrates a typical individual control system for individual memory units. In this figure for electrical completeness the substrate connections are indicated. It is to be understood that since the substrate and the connection thereto is common to all the NOVCIDs no separate connecting leads or structure is present as one might be led to believe from the schematic diagram. It is for this reason that generally the substrate connections are not diagrammed, as in FIG. 2.

We claim:

1. The method of storing, and recovering information stored in nonvolatile form, in a Nonvolatile Charge Injection Device (NOVCID) comprising a well pumped Metal-Nitride-Oxide-Semiconductor, having a word line connection, a bit line connection, and a substrate connection, said method comprising the steps of:
   a. placing approximately a +5 volt potential on the said word line connection, the said bit line connection, and the said substrate connection, thereby placing the said NOVCID in a standby mode;
   b. applying a pulse of approximately zero voltage to the said word line connection placing the NOVCID in accumulation;
   c. placing approximately a +10 volt pulse on the said word line, simultaneously with the placing of approximately +5 volts on the said bit line connection for writing into the NOVCID a "zero", or the simultaneous placing of approximately +10 volts on the said bit line connection for writing into the NOVCID a "one";
   d. transferring the said "zero" or "one" into stored nonvolatile form by applying approximately a +25 volt pulse to the said word line connection; and
   e. recovering the said nonvolatile stored information by first applying approximately 0 volts to the said word line connection and approximately +5 volts to the said substrate connection placing the NOVCID in accumulation, then applying approximately a +10 volt pulse to the said word line connection, while sensing the charge on the said bit line connection which is indicative of the said nonvolatile stored information.

2. The method of transferring to nonvolatile form and recovering information written in volatile form in a Nonvolatile Charge Injection Device (NOVCID) having a field plate, a n+ area, and a substrate, said method comprising the steps of:
   a. applying a pulse of approximately +25 volts and approximately 1 millisecond duration to the said field plate transferring the said volatile written information into nonvolatile form; and
   b. recovering the said nonvolatile stored information by first placing the NOVCID Into accumulation by applying approximately zero volts to the said field plate and approximately +5 volts on the said substrate, then applying a pulse of approximately +10 volts and approximately 50 nsec duration on the said field plate while sensing the magnitude of the said charge on the said n+ area, the magnitude of the said charge being indicative of the said stored information.

* * * * *